United States Patent
Feiertag et al.

(10) Patent No.: US 8,294,535 B2
(45) Date of Patent: Oct. 23, 2012

(54) ELECTRICAL COMPONENT AND PRODUCTION METHOD

(75) Inventors: Gregor Feiertag, Munich (DE); Hans Krüger, Munich (DE); Wolfgang Pahl, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 988 days.

(21) Appl. No.: 11/916,720

(22) PCT Filed: May 24, 2006

(86) PCT No.: PCT/EP2006/004978
§ 371 (c)(1),
(2), (4) Date: Aug. 6, 2008

(87) PCT Pub. No.: WO2006/131216
PCT Pub. Date: Dec. 14, 2006

(65) Prior Publication Data
US 2009/0224851 A1  Sep. 10, 2009

(30) Foreign Application Priority Data
Jun. 7, 2005  (DE) .......................... 10 2005 026 243

(51) Int. Cl.
*H03H 9/64* (2006.01)
(52) U.S. Cl. ..................... 333/187; 333/193; 29/25.35
(58) Field of Classification Search ................... 333/186, 333/187, 193; 29/25.35, 594, 592.1
See application file for complete search history.

(56) References Cited

U.S. PATENT DOCUMENTS

| | | | |
|---|---|---|---|
| 5,249,359 A * | 10/1993 | Schubert et al. ......... | 29/890.039 |
| 6,507,097 B1 | 1/2003 | Goetz et al. | |
| 6,653,913 B2 * | 11/2003 | Klee et al. ..................... | 333/188 |
| 6,693,501 B2 * | 2/2004 | Sawada et al. ................. | 333/193 |
| 6,713,314 B2 | 3/2004 | Wong et al. | |
| 6,852,561 B2 | 2/2005 | Bidard et al. | |
| 6,903,631 B2 * | 6/2005 | Kushitani et al. ............. | 333/193 |
| 6,996,882 B2 * | 2/2006 | Onishi et al. .................. | 29/25.35 |
| 7,042,056 B2 | 5/2006 | Koshido | |
| 7,102,224 B2 | 9/2006 | Pahl | |
| 7,183,622 B2 * | 2/2007 | Heck et al. ..................... | 257/528 |
| 7,196,594 B2 * | 3/2007 | Cheema et al. ................ | 333/133 |
| 7,378,922 B2 | 5/2008 | Kubo et al. | |
| 2004/0032012 A1 | 2/2004 | Wong et al. | |

(Continued)

FOREIGN PATENT DOCUMENTS
EP  1 526 640  4/2005
(Continued)

OTHER PUBLICATIONS

English translation of Written Opinion for PCT/EP2006/004978, Dec. 7, 2007.
Scheiring, C., "New Methods for 3-D Chip Integration Combining Semiconductor Production and Packaging Expertise", Advanced Packaging, Dec. 2003, pp. 33-34.

(Continued)

*Primary Examiner* — Dean O Takaoka
*Assistant Examiner* — Alan Wong
(74) *Attorney, Agent, or Firm* — Fish & Richardson P.C.

(57) ABSTRACT

A component includes a first substrate having a first front side for holding first component structures, and a second substrate having a second front side for holding second component structures. The first and second substrates are connected together electrically and mechanically. The first and second front sides face each other. The first and second component structures include SAW structures, FBAR structures, MEMS sensors or switches, or MEOPS components, or combinations thereof.

39 Claims, 8 Drawing Sheets

U.S. PATENT DOCUMENTS

| | | | |
|---|---|---|---|
| 2004/0157367 A1 | 8/2004 | Wong et al. | |
| 2005/0006987 A1* | 1/2005 | Masuko et al. | 310/344 |
| 2005/0218488 A1* | 10/2005 | Matsuo | 257/678 |
| 2007/0115079 A1 | 5/2007 | Kubo et al. | |

FOREIGN PATENT DOCUMENTS

| | | |
|---|---|---|
| EP | 1 804 376 | 4/2009 |
| JP | 2001345673 A * | 12/2001 |
| JP | 2002043890 | 2/2002 |
| JP | 2002-532934 | 10/2002 |
| JP | 2004-129223 | 4/2004 |
| WO | WO 01/43181 | 6/2001 |
| WO | WO 02/067291 | 8/2002 |
| WO | WO 2004/044980 | 5/2004 |
| WO | WO2006/008940 | 1/2006 |

OTHER PUBLICATIONS

Wang et al., "Liquid Crystal Polymer (LCP) for MEMS: Processes and Applications", Journal of Micromecahnics and Microengineering, May 2003, pp. 628-633.

Search Report from corresponding PCT Application No. PCT/EP2006/004978. mailed Aug. 29, 2006, 4 pages.

Notification of Reasons for Refusal in Japanese Patent Application No. 2008-515086, dated Aug. 24, 2011.

Notification of Reasons for Refusal in Japanese Patent Application No. 2008-515086, dated Jan. 27, 2012.

Machine Translation of Japanese Publication No. 2004-129223 (Pub. Date: Apr. 22, 2004).

\* cited by examiner

ELECTRICAL COMPONENT AND PRODUCTION METHOD

The invention pertains to an electrical component, preferably surface mounted, with sensitive component structures.

Sensitive component structures of this kind are in particular, electro-acoustic converters and resonators. They are sensitive to environmental factors and therefore have to be protected against them. On the other hand, these structures cannot be readily encapsulated, for example, by a potting compound, since the potting compound will affect the propagation of the acoustic wave. Accordingly, today's acoustic components are located in a cavity. The nature and the sealing of this kind of cavity is complicated.

The required cavity can be created, for example, by means of a protective cap. A chip bearing acoustic component structures on its active surface can be glued by its back side to a module substrate which at the same time forms a portion of a housing. The chip is covered by the protective cap, whereby the protective cap makes a tight seal with the module substrate.

It is known to mount a chip carrying acoustic component structures on its active surface in a flip-chip-array on a module substrate with several, for example, ceramic layers. The gap between the chip and the module substrate can be sealed, for example, by a sealing frame. The entire device can be covered by a cover.

It is also known to create additional passive circuit elements in a multilayer ceramic module substrate. The module substrate in this case is used as a component carrier, and its outer connections are on its underside.

An additional possibility for production of a multifunctional module with a plurality of different types of active and/or passive components is the monolithic integration of different circuits in a common substrate (preferably a semiconductor substrate such as silicon), wherein depending on the complexity of the structures to be created, a plurality of consecutive process sequences is to be implemented. Component structures operating with acoustic waves, however, cannot be integrated into a monolithic module at low cost.

In addition, the production of a component by joining two wafers (wafer-level-package by means of direct wafer bonding) is known, whereby a component structure formed on a first wafer is enclosed in a depression formed in a second wafer and is housed in this manner. In this case, the wafers are first connected to each other and the composite wafer is divided into individual components. One of the wafers is used in this case as a housing or a cover for the other wafer, and if necessary to accommodate the conductor paths.

In addition to the components operating with acoustic waves, a number of other component types with sensitive component structures are known that are shielded in a similar manner and have to be surrounded by a package. These are, in particular, encapsulated components of the MEMS (microelectromechanical system), MEOPS (micro-electro-optical system) or MEOMS (micro-electro-optical-mechanical system) types, which can all be a chip bearing the essential component functions, mounted on a panel in a flip chip design, or can be connected in a wafer bonding method to a wafer as carrier.

Another problem of components with sensitive component structures is their thermal stress, which occurs in the case of substrates joined together and having different thermal coefficient of expansion, and which can result in malfunction of the component or to damage to component structures. Due to these stresses, the diameter of the solder pad and thus also of the bumps of flip chip bonded components cannot be reduced much below 100 µm if the system requirements to be specified below are to be satisfied. Only by means of large bumps can the thermal stresses be relieved without damage to the component structures.

It is the purpose of the present invention to specify an easily produced electrical component with sensitive component structures that makes possible an additional miniaturization without endangering the component itself.

This problem is solved according to the invention by a component with the properties of Claim 1. Favorable embodiments of the invention, and also a method for production of the component, are indicated in the additional claims.

The invention proposes a first and a second substrate, each bearing component structures that are joined together so that cavities are created for the component structures in a sandwich-like composite. This is achieved in that the substrates are joined together with the aid of spacer structures via the front sides bearing the component structures.

The component structures can be chosen independently of each other, as SAW structures, FBAR structures, MEMS sensors (=micro-electro-mechanical system), MEMS-circuits, MEOPS components (=micro-electro-optical system), MEOMS components (=micro-electro-optical-mechanical system) or combinations thereof. The new component can realize in a single structural element different component types created on the two substrates or designed with the two component structures. However, the component can also distribute its component functions to two substrates and thus can be produced with far smaller surface area in comparison to known components designed essentially on one substrate.

With the invention, a 3D-integration by means of a known sandwich design of two substrates is possible, since also the second substrate, which is used in known components exclusively for encapsulation of the first component structures and in the best case is used as a carrier for passive circuit structures, can now also be employed for active component structures. In this case, the sensitive component structures of the two substrates can jointly use the cavities which are created between the spacers when joining the substrates.

A number of commonly used crystalline substrates have an anisotropy with regard to their thermal coefficient of expansion. These substrates expand differently along different crystalline axes. In particular in known composites, this has various adverse effects and increases the tendency to malfunction and the likelihood of damage to these components.

In one embodiment, a substrate has an anisotropy with regard to the thermal coefficient of expansion TCE (temperature coefficient of expansion). The second substrate is then selected so that the thermal coefficients of expansion are matched and the difference of the coefficient of expansion in any direction within the substrate plane (xy plane) is less than or equal to 3 ppm/K. Usually this can only be achieved when the second substrate is also accordingly anisotropic. Thermally matched substrates consist either of the same material or are selected from materials with correspondingly suitable thermal coefficient of expansion. As a degree of freedom within certain material classes, the angle of intersection, which can be varied to change the coefficient of expansion, can also be used.

A structured intermediate layer can be used as spacers between the first and second substrate. The structuring of the intermediate layer is designed so that recesses in which the component structures are located are created in the intermediate layer. Accordingly, the intermediate layer can be configured as frame structures which surround the component structures. In a sandwich-like composite design, the recesses then form the cavities for the component structures which in this manner are safely shielded against chemical and mechanical influences. Also, the enclosed cavity assures that in any subsequent packaging process, liquid encapsulating media such as reactive resins or molten polymers can be applied with no danger to the component structures.

All materials which can be applied in a structured manner, are compatible with the manufacturing method, and are suitable for remaining in the component can be used for the intermediate layer. Polymer materials, in particular directly photo-structured resists and foils, are highly compatible. Also, metallic intermediate layers are suitable and are characterized by high structural accuracy, good adhesion and hermetically tight bonding to most substrates. Also, materials can be used which change chemically or in structure during the course of the process, in particular during bonding of the substrates.

Both the first and second component structures can be components operating with acoustic waves. Therefore, pure or mixed combinations of FBAR components and SAW components can be created with the proposed component. In this manner it is possible to integrate two SAW component structures or two FBAR component structures in one component, which together create several component functionalities.

The component has common outer connections, which are located, for example, on the back side of one of the two substrates. It is also possible to locate the outer connections on the front side of the "lower" substrate and to provide an opening for this in the second substrate located above so that the outer contact is accessible from above, for soldering purposes for example. It is also possible for the edge length of the upper, second substrate to be made smaller than that of the lower, first substrate, so that there will be enough space in the protruding portion of the first substrate for the outer contacts.

The outer contacts can be connected to the component structures of the first and/or second substrate by means of electrically conducting feedthroughs. However, it is possible to design the electrical connection between the component structures and the outer junctions by means of connection lines which run from the component structures outward and then across the outer edge of the upper substrate. It is also possible to produce the outer connections both by means of feedthroughs and also by means of connecting leads which are run across one substrate edge.

In the case of electrical connection leads running along the outer edge of a substrate, this edge should be beveled. In this regard it is an advantage if the outer edges of all substrates and intermediate layers or partial layers are aligned. This makes it easier to apply the connection lines to the preferably beveled outer edges.

The electrical component structures of the first and second substrate can be joined together by means of electrical connections. These connections can be run directly across the space within the aforementioned cavity in the structured layer, or in general between the spacers. However, it is also possible to run all electrical connections across the preferably beveled outer edges of one or several substrates, and thereby to execute the associated connections on the outer edge or preferably on the back side of the upper substrate.

An additional possibility consists in making all connections of the component which are distributed onto two substrates available on the front side of a single substrate. To do this, a number of electrical connections are created for the second substrate that will correspond to the number of contact surfaces on a first substrate. All connections of the second substrate and also the connections of the first substrate guided through the connections on the second substrate, are then run along connection lines to the contacts. Alternatively or in addition, the connection lines can be run out to the outer contacts by means of feedthroughs on the back side of the upper wafer.

The electrical connection between first and second component structures can also be run directly through the intermediate layer and not placed in the cavity intended for the component structures. In this case, the electrical connections represent feedthroughs through the intermediate layer, that is, holes filled with conductive material running through the intermediate layer.

The height of the component can be reduced by thinning at least one of the substrates from the back side before application of the back side contacts. The stability of the thinned substrate in this case will be additionally assured through bonding to the second substrate. It is also possible to increase the stability by means of additional support structures between the first and second substrate, or to structure the intermediate layer accordingly. If the composite is sufficiently stable, it is also possible to thin both substrates.

It is preferred for both substrates to be crystalline. Then the component structures can be designed directly in or on the crystalline substrate. However, it is also possible to create a thin layer on a crystalline substrate and to place component structures on or in this thin layer. For example, the thin layer can be a piezoelectric layer and the metallization of component structures for a SAW component can be produced thereon. However, the piezoelectric layer can also be a part of the layer structure which is created on the substrate of a FBAR resonator, or a component composed from structured and interconnected FBAR resonators Crystalline substrates with anisotropic characteristics with respect to the coefficient of expansion can be, in particular, materials such as lithium tantalate, lithium niobate or quartz. As anisotropic substrates, we can also use foils and laminates made of liquid crystalline polymers (LCP) or laminates made of polymers reinforced with oriented fibers. Through suitable selection of the liquid crystalline polymers, for example, aromatic polyesters, or by suitable methods in the production of the LCPs, in particular also by suitable treatment in the melt, it is possible to configure the thermal coefficient of expansion in an anisotropic manner and to adapt it to a desired value, in particular to that of the second substrate. LCP substrates can be used as carriers for additional component materials, for example, as carrier material for thin, piezoelectric layers, which in turn then act as carriers for the component structures for SAW components or as parts of the component structures of FBAR components. In addition, LCP substrates are distinguished by high thermal, chemical and mechanical stability, by a low water absorption (for polymers) of about 0.02%, for instance, and by an outstanding barrier effect against the permeation of gases or water vapor. They also have favorable high frequency properties, in particular a low loss factor and are therefore highly suitable as substrates for SAW and FBAR components. The adjustment of desired anisotropic characteristics is also possible by lamination of different foils with different anisotropic characteristics, wherein the axes of maximum change in characteristic can be positioned in different foils of the laminate, and even at different angles to each other. Fire adjustment of these properties is possible through variation of the number, layer thickness and/or alignment of various foils. The effects can also be attenuated or amplified by the use of fillers, in the latter case by means of oriented fibers, for example.

It is also possible with regard to the proposed component to form one of the substrates on an optimal substrate for the component function. The second substrate will then be chosen with regard to a matched coefficient of expansion. In this case, it is acceptable that the substrate material of the second substrate will no longer be optimal for obtaining the desired component function. However, this can be compensated by corresponding configuration of the component structures. Nonetheless, a degree of miniaturization with regard to compactness and outer dimensions can be achieved in the composite of the first and second substrate that has heretofore not been possible.

The second substrate can also be adapted to the coefficient of expansion of the first substrate by special means, for example, by mechanical joining with a constraining layer, which will then also affect the properties of the composite.

In addition or alternatively, the temperature coefficient of a desired or critical property of the component structures can be adapted to the second substrate by appropriate electrical interconnection, so that a behavior tailored to this quantity will be obtained on both substrates of the component.

For example, it is possible to offset critical SAW component structures on anisotropic substrates with respect to each other, in order to achieve changed temperature dependencies for these component structures. It is also possible to use electrical averaging between component structures whose temperature dependence is opposite on the two substrates, to achieve a good overall adaptation.

It is also possible to create a composite with the two substrates, in which the temperature constants are compensated by sufficiently tight mechanical coupling and corresponding oppositely-directed thermal behavior.

At the same time, the effort required for production of a cavity housing for a single substrate with component structures for state of the art components can now be used for production of cavity housings for nearly twice the quantity of component structures. This also represents a considerable simplification of the process and reduces the manufacturing costs and the time and labor needed for production.

Suitable substrate combinations for the first substrate include a crystalline piezoelectric material, such as lithium tantalate or lithium niobate, for example. This can be combined favorably with a second substrate of quartz, wherein a matching of the coefficient of expansion will be assured through appropriate selection of the cut through the quartz substrate. An additional advantage of the quartz substrate is the now favorable price of these substrates that have piezoelectric properties, so that acoustic components such as SAW or FBAR can be created even on quartz.

In an additional configuration, the component can also have additional passive components on the front side of one or both substrates; these can be created in the form of appropriately structured metallization. Structures of this kind can be resistors, capacitors and inductors. They can also be located on the back side of one or both substrates. The passive components are connected by means of appropriate connection lines to the component structures of one or both substrates.

A component with additional, simplified structure is obtained when the front side of a first substrate is additionally used as the second metallization plane for interconnections of second component structures on the second substrate. For example, it will thus be possible to design circuit path segments on the front side of the first substrate which have both ends guided along connections to two connecting sites on the front side of the second substrate, and which are connected there with two corresponding component structures. The orientation of the connecting sites and of the circuit path segment can be chosen so that in this manner structures sensitive to mechanical or electrical contact will be crossed on the second substrate in the second plane, or on the front side of the first substrate, without them additionally having to be isolated from each other. Structures of this type can be one or several circuit paths, acoustic traces, reflectors or the like. In this manner, a simplification of the interwiring structure on the substrate surfaces and complicated circuit path leads on the substrate surface will be unnecessary.

In an additional configuration it is possible to create a second metallization plane for production of interconnections by means of a two-part intermediate layer. If a partial layer of the intermediate layer is structured on each of the two substrates, then a metallization plane can be created on the surface of one or both intermediate layers that is composed in particular of circuit path segments and electrical connection lines, for example, connection lines leading to the outside. After joining of the two substrates, this additional interwiring plane is embedded between the two partial layers of the intermediate layer. However, it is also possible to have a different structuring of the partial layers of the intermediate layer on both substrates, wherein structural regions on the two substrates are coincident and can be joined directly with each other, whereas other structured regions will then have no corresponding counterpart on the other substrate. A cavity will remain between these structured regions and the surface of the other substrate after bonding of the substrates. It is also possible to design all electrical connection lines for the component structures in one such additional metallization plane located between two partial layers of a two-layer intermediate layer. This has the advantage that all electrical contacts can be placed on one plane and the connection lines do not take up any additional substrate surface area. The structuring of the intermediate layer or of the partial layers of the intermediate layer, is designed in this case so that the mechanically sensitive, active component structures of the component are not covered by the intermediate layer. A second metallization plane can therefore be located advantageously only in the regions in which only mechanically insensitive electric supply lines and contact surfaces are found.

The component can also have an intermediate layer (ZS) comprised of at least three partial layers, wherein a middle, partial layer is designed as a large-area plane. The upper and the lower partial layers are then designed as spacer structures, each between one of the substrates and the middle partial layer. Then electrical lines can be run along the middle partial layer. To do this, it can be made in a fully conducting design. However, it is preferable to design it as an insulator with circuit paths on both sides leading outside to the edges of the component, being connected there to external connections of the component. In this case, the circuit paths can be exceptionally low-induction and are thus suitable in particular for low-inductance connection to ground. In this regard it is possible to run all ground connections of the component structures along the middle partial layer to the outer edges of the component.

The electrical connection to the component structures can occur across the upper and lower partial layers or across connecting and joining elements specifically structured on the surface of the substrates.

The middle, solid partial layer is preferably adapted in at least one direction within the plane to the TCE of one of the two substrates, e.g., to less than +/−3 ppm/K. Then preferably all circuit paths will be run along this partial layer in parallel to TCE adjusted direction.

Metallization on substrate front sides, on intermediate layers and/or at the outer edges of the substrates, can also be used to form large inductors with high electrical quality, by structuring several windings there. A very large inductor is obtained when one or several windings are appropriately created on the outer edge of one or both substrates from a metallization applied thereon, or are structured directly thereon.

The two partial layers of the intermediate layer can also have different thicknesses. Thus it is also possible to have a defined spacing between two metallizations in different metallization planes, which is optimized for the particular purpose. Therefore, it is possible, by means of opposing placement of two metallizations at a certain separation, to create a defined electrical arcing path which—upon occurrence of undesirable overvoltages, for example due to ESD (electrostatic discharge)—will shunt these arcs to ground without harming the component structures.

The composite made of the first and second substrate can be located on a carrier and connected electrically to it along its outer connectors. The carrier is mechanically stable and has in particular a multiple layer design and can have several metallization planes with interconnected structures and passive component structures implemented therein. A multiple layer carrier can be based, for example, on a plastic laminate or a multiple layer ceramic. Additional interconnections of first and second component structures can be implemented in or on the carrier. In particular, the carrier is suitable for those structures and circuit elements which require only a dielectric substrate.

The composite component is soldered to the carrier so that the carrier will ensure an additional mechanical stability for the overall configuration. It is possible, for example, first to thin one of the two substrates of the composite substrate, which will subsequently receive the outer connections. After joining with the carrier, the back side of the second substrate can also be thinned without thereby jeopardizing the stability of the overall composite.

In one design, the carrier can be used for production of a known packing for the component. To do this, the chip on the carrier will be covered by a cover so that it tightly seals the component with the carrier. The covering can be a plastic layer, which is produced for example, by type casting, as a laminate foil, as glob-top or by injection molding.

The carrier can have an interconnected structure that will connect the tightly packed contact surfaces located on the surface of the carrier with solderable contacts at the underside of the carrier such that the spacing of the solderable contacts is greater than that of the contact surfaces.

Due to the attachment of the substrate composite on the carrier by means of solder joints, the underside of the lower substrate facing the carrier will be shielded, as in a flip-chip array. It is therefore possible to place additional sensitive component structures on this surface of the lower substrate and to join them electrically with the carrier.

It is preferable for the component to have an electromagnetic shielding layer as its outermost layer. This can be, for example, a metal layer on the back side of the upper substrate S1 that has no external connections. It is also possible to provide this shielding layer on or under a covering, like the already mentioned glob-top, for example.

In addition, it is preferred that the outer surface of the component can be written on. In this regard, it can have two contrast-forming layers or layered regions, one of which can be removed by laser. Also, layers whose color can change are also possible. Preferably the contrast forming layers will be metal layers, one of which can also be a part of the shielding.

The invention will be explained in greater detail below based on embodiments and their associated figures. These are intended merely to illustrate the invention and are therefore presented only schematically and are not true to scale. Equivalent or similar parts are denoted by the same reference symbols.

Figure 1:
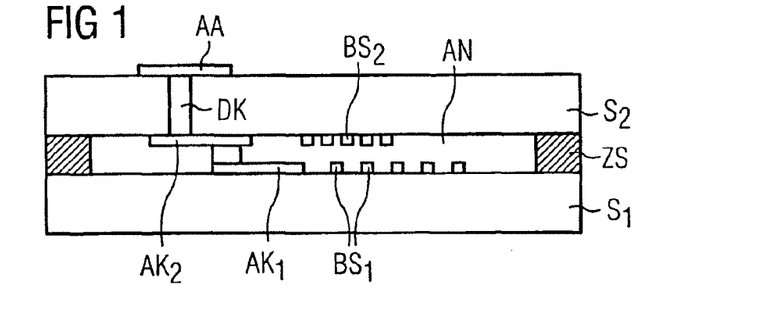
FIG. 1 shows a first component with feedthroughs.

FIG. 1 shows a first embodiment of a component in schematic cross section. On a first substrate S1 there are the first component structures BS1 which are electrically connected with associated connection contacts AK1. On a second substrate S2 there are second component structures BS2 and associated electrically conducting connection contacts AK2. The two substrates S1, S2 are connected to the front sides supporting the component structures BS, wherein a structured intermediate layer ZS, which leaves open the region of the component structures BS, operates as a spacer. For FBAR and SAW component structures, for example, a 5 µm separation of the substrate surfaces is usually sufficient to guarantee a safe operation of the mechanically sensitive component structures created within the cavity. The two connection contacts AK1, AK2 are joined together by means of electrical connectors VL which are run directly across the free space between the two front sides here. The two connection contacts in this configuration are located directly opposite each other. Electrical outer connections AA for the first and second component structures are on the back side of the second substrate S2. These are connected by means of feedthroughs DK passing through the second substrate (upper substrate in the figure) with the connection contacts on the front side. In the illustration the feedthroughs lead only to the connection contact AK2 of the upper, second substrate S2. This design is suitable in particular for substrates that are composed of at least one plastic layer, since here the feedthroughs are easy to produce.

The first and/or second substrate can be made of piezoelectric material and can be produced, for example, from lithium tantalite or lithium niobate wafers. Both substrates have their coefficients of expansion matched to each other in the substrate plane so that the deviation is a maximum 3 ppm/K. This is ensured for different substrate materials by a suitably placed cut through the anisotropic material. The second substrate S2 can also be a monocrystalline quartz substrate. The component structures can then be metalized for interdigital transducers and reflectors. The intermediate layer ZS should be structured so that it encloses the component structures of both substrates S so that they are located in the sandwich arrangement in a cavity between the two substrates. The intermediate layer is preferably made of electrically insulating material. Also, metallic frames, which can be produced and structured galvanically or without current, are also easy to design and manufacture.

If partial layers of the intermediate layer are applied to different substrates and structured in the form of metal frames, they can then be used for mechanical bonding of the two substrates, for example, by means of diffusion soldering. In this case, an alloy formation is triggered merely by mechanical contact of two metal layers of components at elevated temperature under inert gas, wherein an intermetallic phase with a higher melting point can form. Suitable for this is e.g., $Cu_3Sn$, which under certain conditions can form from pure or mixed Cu- or Sn-layers. If the thickness of the starting layers is selected appropriately, then the partial layers can pass entirely into this new phase. $Cu_3Sn$ also advantageously has a sufficient elasticity which will stabilize the composite. Diffusion soldering can be used for all substrates that are stable at the required temperatures, as well as a number of common LCP materials.

However, other methods such as soldering, adhesion or other known wafer bonding methods are suitable for the joining process.

Figure 2:
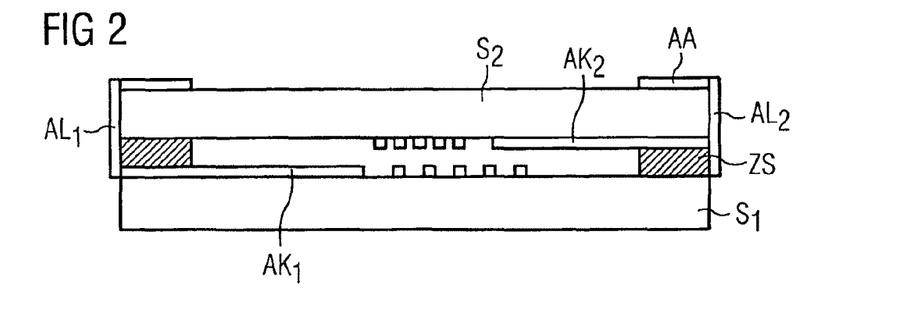
FIG. 2 shows a second component with connection lines run along the outer edge.

FIG. 2 shows an additional embodiment of a component in schematic cross section. Here the outer edges of the substrate are illustrated as approximately vertical, but they can also be beveled from above at least in part, so that the application and structuring of the metallization on the outer edges will be made easier. Beveled outer edges can also be used in all subsequent embodiments in place of the illustrated vertical edges. The connection contacts AK on the front side of the two substrates, which are electrically joined to the component structures BS, are each guided up to the outer edges and intersect them. The outer connections AA are located on the back side of the upper, second substrate S2. On the beveled outer edges of the component are the connection lines AL that intersect the outer edge of the component and electrically connect the connection contacts on the substrate front sides with the stated outer contacts AA on the back side of the second substrate S2. The connection lines are structured so that a suitable connection line and a corresponding outer connection AA on the back side are each allocated to one or several connection contacts on the front side of one of the two substrates. Even though the intermediate layer ZS here is located partly above the connection contacts running to the outside, it is still structured and planarized so that the recess AN in the interior of the sandwich structure seals it tightly.

Figure 3:
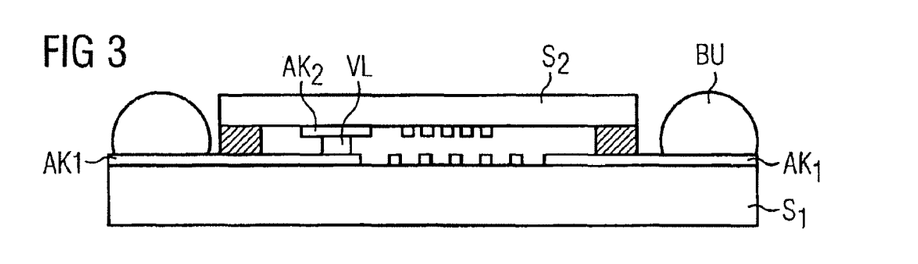
FIG. 3 shows a third component with electrical outer contacts on the front side of the lower substrate.

FIG. 3 shows an additional embodiment in which two substrates are connected to each other by their front sides, with placement of a structured intermediate layer ZS in between. The base surface of the upper, second substrate S2 in this case is smaller than that of the lower one, so that the lower, first substrate S1 protrudes accordingly. The connection contacts AK of the lower, first substrate S1 are run into this protruding region and secured there. The connection contacts AK2 of the second substrate S2 are joined across electrical connectors VL with connection contacts AK1 on the front side of the lower, first substrate S1 and likewise run into the free, protruding region of the first substrate S1 not covered by the first substrate. By means of an appropriate joining method, for example, by use of a sufficiently high bump BU, the component consisting of the component structures BS1, BS2 on the two substrates can be electrically connected to the outside world and mounted on a carrier or a circuit board. Therefore, in this design all electrical connections of the two substrates are run on the front side of the lower substrate and are then connected from there with the outside world.

An additional possibility, not illustrated, consists in combining the possible connections illustrated in FIGS. 1 and 2 that use feedthroughs DK or connection lines AL guided via a beveled outer edge, and providing both possibilities in one component.

Figure 4:
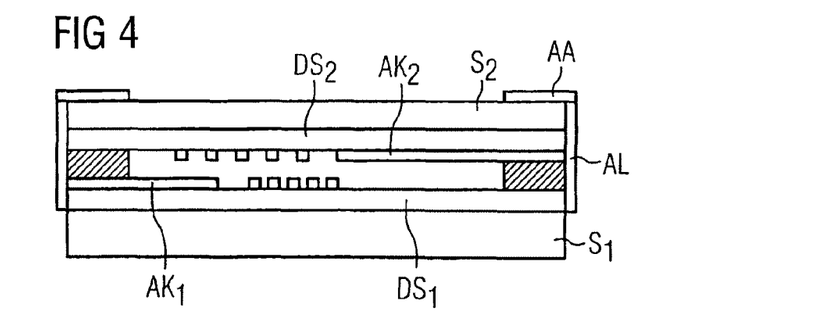
FIG. 4 shows a component with thin layers on the substrate.

FIG. 4 shows an additional embodiment in which the substrates themselves are modified. The substrates S1 and S2 are each composed of an anisotropic crystalline material which is coated on the front side by a thin layer DS on which the particular component structures BS are created. The two substrates here can be made of the same material, whereas the thin layers DS can be produced from different material. The thermal behavior and the thermo-mechanical matching of the substrates equipped with the thin layer, and in particular the temperature coefficient of the central frequency for HF components such as SAW implemented thereon, is in this case determined essentially by the substrate material, since its thickness is large in comparison to that of the thin layer.

These substrates S equipped with a thin layer DS can also be joined together using a bonding technique like that illustrated in FIGS. 1 to 3 and contacted with common outer connections AA. In FIG. 4 the contacting with outer connections AA takes place by means of connection lines AL, which are run along the edge of the component and are joined electrically with the connection contacts, which open out at the edge, on the respective substrate front sides or on the surface of the respective thin layers. Here, too, the structured intermediate layer ensures a sufficient distance between the substrates so that the component structures BS are securely arrayed in the recess of the sandwich structure without any mechanical stress.

Although not illustrated, it is also possible to run connection lines between different metalized planes or substrates, for example, between component structures on different substrates, across an outer edge of the intermediate layer which aligns with a substrate edge. These connections or interconnections are particularly easy to create, and do not require any additional process expense.

Figure 5:
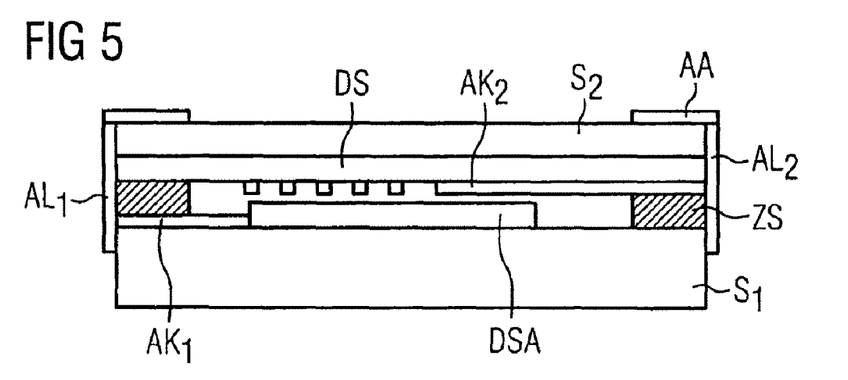
FIG. 5 shows a component with two different component structures, one of which is designed as a thin layer.

FIG. 5 shows an additional embodiment of a component in which, again, a first and a second substrate S1, S2 are joined together, with a spacer, for example, a structured intermediate layer ZS, placed between them. The component structures BS of the first substrate S1 are designed here as a thin layer DSA structure and represent an HF filter, for example, made from FBAR resonators. The second, upper substrate S2 is also equipped with a thin layer DS of a material which acts as a substrate for the second component structures BS2, which are provided here, for example, in the form of metallization for a SAW component on the front side (on the underside in the figure) of the second substrate S2. In addition, on the front sides there are still the connection contacts AK which are joined electrically with the corresponding component structures BS or the thin layer DSA structure, respectively, and lead to an also beveled outer edge of the component, where they are connected by means of connection lines AL to outer junctions AA on the back side of the upper, second substrate S2. Different connection methods, as illustrated in FIGS. 1 to 3, are possible for these substrate elements or components as well. It is also possible to use combinations of the illustrated methods for electrically connecting the component structures.

The FBAR resonators can be the SMR type (solidly mounted resonator) or the bridge type. The former are located on an acoustical reflector which can be designed as a lowest layer combination of the thin layer DSA structure. In the bridge type, the resonators are located on a membrane within the thin layer DSA structure, which bridges a recess in the thin layer DSA structure or in the substrate in the vicinity of the resonators.

Figure 6:
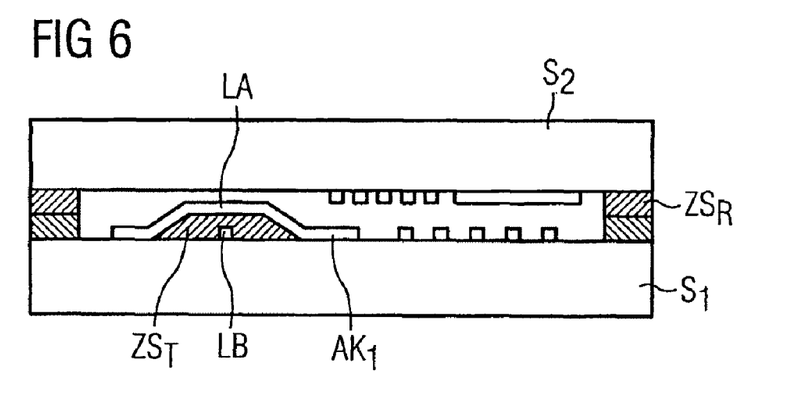
FIG. 6 shows an embodiment with structured intermediate layer.

FIG. 6 shows an additional embodiment using a schematic cross section. This design pertains to a variation of the intermediate layer, which is a double layer here, and a partial layer of the intermediate layer is associated with each of the substrates S1 and S2. The partial layers of the intermediate layers can be structured independently of each other on each substrate. The regions $ZS_R$ operating as spacers can be structured similarly; they in turn surround the component structures in a frame-like manner to form a cavity.

On the front side of at least one of the substrates S the particular partial layer of the intermediate layer $ZS_T$ can be structured without the opposing counterpart on the other substrate. In this case, the intermediate layer ZS or the partial layer $ZS_T$ associated with it is designed using electrically insulating material. Then an additional level will be available on independently structured partial layers $ZS_T$ to which component structures, connection lines or any other circuit path segments can be positioned and connected to component structures or outer contacts AK.

If metallization is applied to structured partial layers $ZS_T$ over a first substrate S1, then it is preferable to equip this partial layer with at least one beveled edge along which the metallization is guided out to the metallization on the substrate S1. The mutual electrical connection between the component structures on both substrates can be made along said metallization on a structured partial layer when these metallizations make an electrical and mechanical contact with each other when bonding both substrates using a suitable bonding technique.

This second level can also be used, as in the illustration, to produce intersections of structures, such as circuit paths, as is indicated in FIG. 6. Here a circuit path segment LA, which is bonded to a connection contact AK1, is run along the top side of the structured partial layer $ZS_T$. Transverse thereto and running underneath this partial layer $ZS_T$ is an additional circuit path LB which is likewise bonded to component structures BS1 of the first substrate. By the use of these intersections it is possible to greatly simplify the guidance of the electrical connection contacts AK and of the needed circuit paths on the surface of the substrate, since the circuit paths now run essentially in a straight line and can be made shorter. The circuit paths and circuit path segments can be electrical conductors bonding the extended connection contacts or component structures. In comparison to circuit paths that rest directly upon the surface of the substrate, merely one additional metallization step is required for production of this configuration. The contacting of the component structures by means of their connection contacts AK using the techniques already described above is not illustrated.

Figure 7:
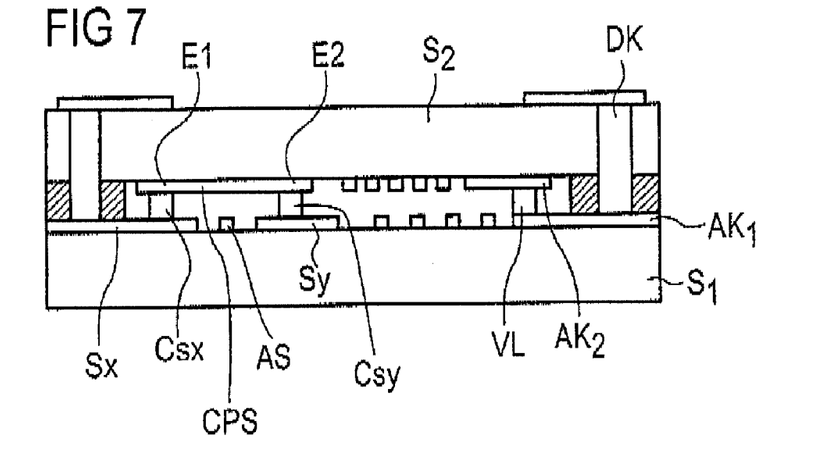
FIG. 7 shows a component with isolated feedthroughs

FIG. 7 uses a schematic cross section to show one additional possibility of how connection contacts on the front side of one of the two substrates can be contacted. All connection contacts AK2 of the component structures BS2 of the second substrate S2 are by means of connection conductors VL across the space directly joined with connection contacts AK1 on the front side of the lower, first substrate S1. The joining of these connection contacts with outer connections AA located on the back side of the second substrate S2 is enabled by feedthroughs DK that run through the second substrate S2 and the intermediate layer $ZS_R$. The intermediate layer ZS in this case is structured so that it is wider in the region of the feedthrough DK. This makes it possible to create the feedthrough entirely within one layer region of the intermediate layer, so that production of the feedthroughs is easier.

These contacts can be created, for example, by boring and/or etching from the back side of the second substrate S2, and the surface of the connection contacts AK1 on the front side of the first substrate S1 can be used as an etching stop. Since the bored hole does not open out inside the cavity with the component structures, it can be easily filled with electrically conductive material.

However, it is also possible—in contrast to the design illustrated in FIG. 7—to run feedthroughs both to connection contacts on the first substrate and also to connection contacts on the second substrate. This can be simplified, even though a layer region of the intermediate layer is located in the region of the feedthrough, or the intermediate layer is structured accordingly. In the case of over-etching or if the bore hole is too deep, this will also prevent the recess or the cavity with the component structures between the two substrates from being opened, and the electrically conductive material can be located in a bore hole enclosed on all sides.

FIG. 7 also shows that the second substrate S2 includes a circuit path section CPS having ends E1 and E2 that constitute direct connections to connecting sites CSX and CSY without a direct electrical or mechanical connection between the connecting sites CSX and CSy that are located on the first surface of the first substrate. Element AS is a structure that is between sites CSX and CSY.

Figure 9:
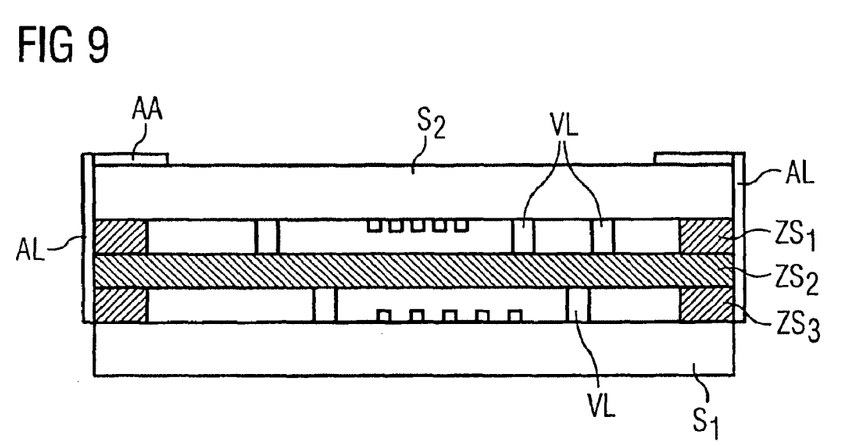
FIG. 9 shows a component with a middle level of the intermediate layer designed as ground connection.

FIG. 9 presents a schematic cross section of a component with a three-layer intermediate layer, of which the middle sublayer ZS2 is designed as a continuous layer for the ground connection. The electrical contact to the two component structures is effected directly across the space by means of connecting conductors VL. The middle sublayer ZS2 can be conductive or at least have circuit path structures that lead outward to the junction lines AL, which in turn lead to the outer connectors AA. The other connections (not illustrated) can likewise run across additional junction lines which can be bonded to the component structures in the manner already described.

Figure 10:
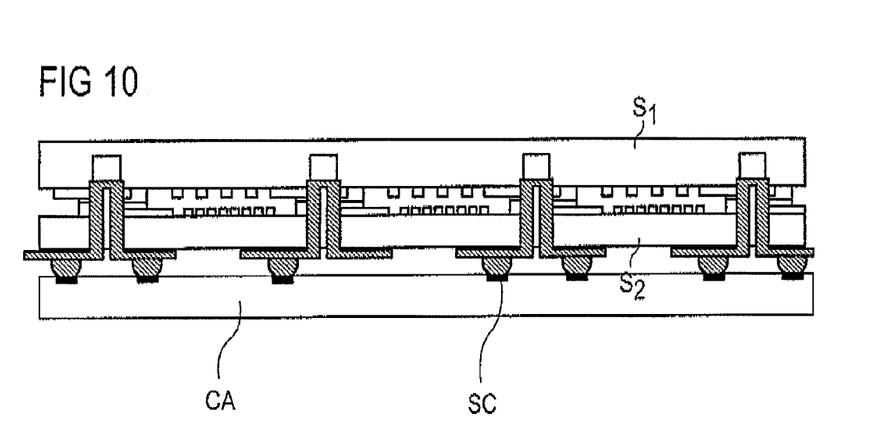
FIG. 10 shows a carrier that is electrically and mechanically connected, via solderable contacts, to an electrical component component.

FIG. 10 shows a carrier CA that is electrically and mechanically connected, via solderable contacts SC, to the electrical component component comprised of the first substrate (S1) and the second substrate (S2).

Figure 11:
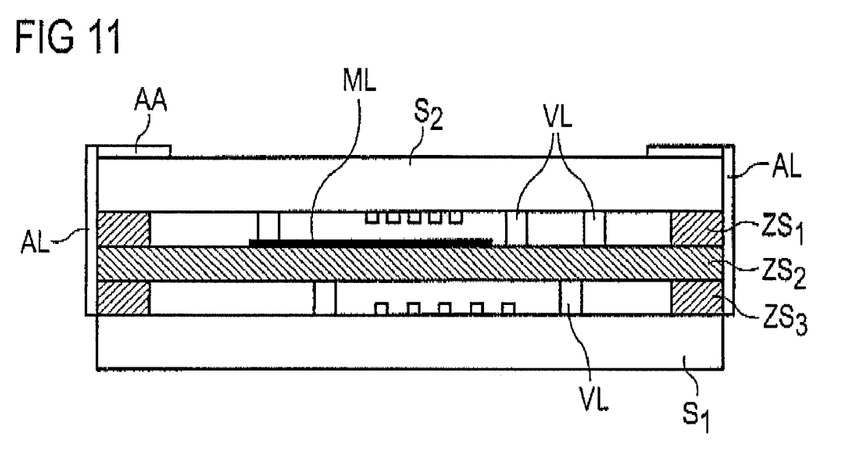
FIG. 11 shows a component structure having a metallized layer.

FIG. 11 shows a component structure having a metallized layer (ML) on an isolating layer (ZS2).

FIG. 8 shows a selected manufacturing method based on characteristic process steps, which are each presented as a schematic cross section through the substrate or substrates.

Figure 8A:
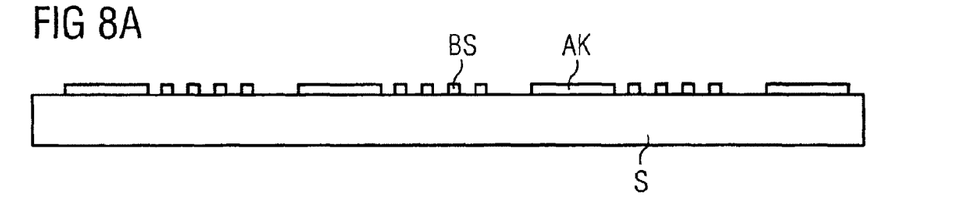
FIG. 8 shows different process steps in the manufacture of a component.

FIG. 8A shows a first substrate with component structures located thereon and its connection contacts AK. Accordingly, a second substrate with second component structures BS2 is provided. As substrates, large area wafers of the particular substrate material are used, on whose front sides component structures are provided for a number of components.

Figure 8B:
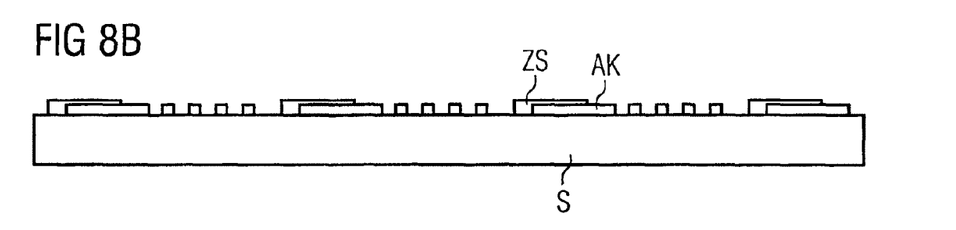

In the next step, an intermediate layer ZS is applied onto at least one of the two substrates and is structured in the desired manner. FIG. 8B, for example, shows only the regions of the intermediate layer designed as spacer structures. Preferably, frame-like structures are used in the structuring step that each fully enclose the component structures for one component. In the embodiment presented as an example, the intermediate layer is made of electrically insulating material and consists of a structurable polymer, for instance. In this case, the intermediate layer can be applied in liquid form to the entire surface, by using droplets, by spin-coating, or by tape casting. It is also possible to laminate the foil. It is preferable for the intermediate layer to be light sensitive, which will permit a simple structuring by means of photolithography. However, the intermediate layer can also be applied as already structured, for example, by pressure.

The first and second substrate are now joined together so that mutually associated component structures BS and also the partial layers, if any, will each be positioned appropriately for the spacer structure.

Figure 8C:
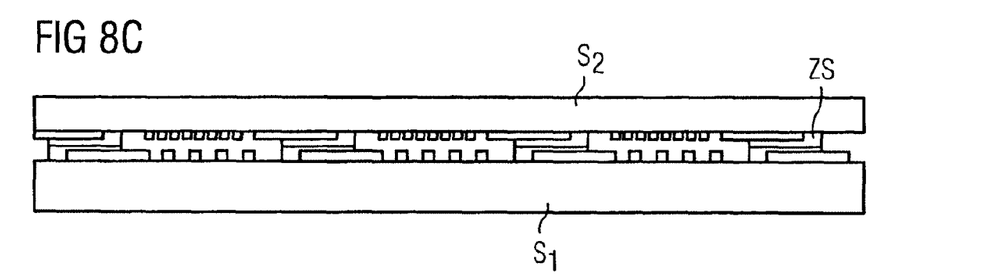

FIG. 8C shows the configuration after bonding of the substrates. The mechanical bonding can be effected by means of adhesive, wherein the intermediate layer itself can function as the adhesive, or it can be equipped with an adhesive. It is also possible to produce the intermediate layer from a thermoplastic and to conduct the bonding by melting the intermediate layer. Each two component structures BS on the two substrates S1, S2 that are associated with one component are now arranged inside a common cavity between the two substrates surrounded by the structured intermediate layer.

Figure 8D:
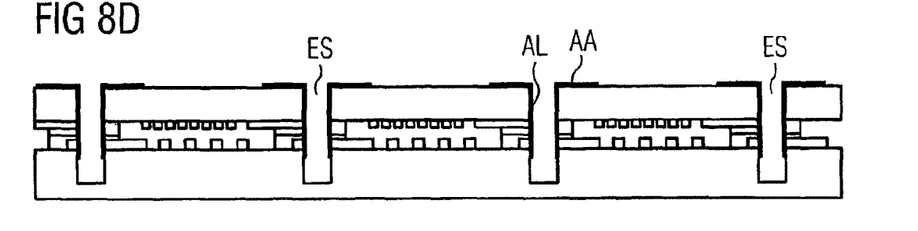

FIG. 8D shows a simple possibility of how the electrical contacting of the component structures at the wafer level can be performed in one step for all components created on the wafer. To do this, notches ES are cut from the back side of the second substrate S2 that are preferably tapered and have a V-shaped cross section, for example. Each notch is created in the region of the structured intermediate layer, so that the cavities with the component structures are not opened. In this case, the connection contacts at the particular substrate surfaces are exposed in the notches at the same time. The notches are preferably created as straight line cuts, so that a checkerboard-like pattern of notches is created that separate the individual component regions from each other.

In the next step, the whole-surface metallization is deposited and structured onto the back side of the second substrate S2 and within the notches. The structuring takes place so that in one step, both the outer connections AA and also the junction lines AL within the notches are structured, which connects each outer connection to a corresponding connection contact on a substrate front side. The metallization preferably takes place in two steps, wherein a thin base layer is applied, preferably from the gas phase, for example, by vapor coating or sputtering, and is then reinforced galvanically or by non-electrical methods. The structuring can proceed with a photographic method that covers regions not to be reinforced during the galvanic or non-electrical reinforcement of the base metallization. Once a sufficient layer thickness is created, then both the mask and also any regions of the base metallization remaining underneath are removed. FIG. 8D shows the configuration after production of junction lines and outer connections.

Figure 8E:
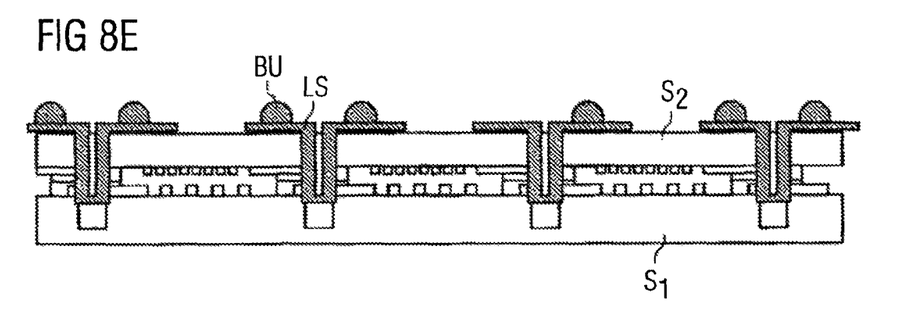

In the next step a solder stop lacquer LS is applied and structured so that only the regions of the outer connections AA needed for production of bumps remain uncovered. The bumps can then be created in a simple manner at these sites by treatment with liquid solder, which adheres only to the surfaces free of solder stop lacquer and the desired solder balls corresponding to the bumps will be formed. FIG. 8E shows the configuration after this process step.

Figure 8F:
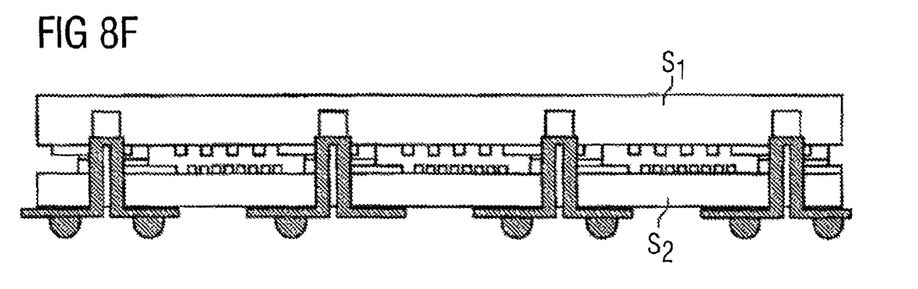

In the next step, the previously created composite will be bonded to an auxiliary support (not illustrated) by means of the back side of the second substrate equipped with the bumps, so that it will be supported or securely seated on the auxiliary support. Next, the first substrate S1 in the top of FIG. 8F is thinned from the back side. To do this, prior art processes such as CMP, grinding, or milling can be used. In this case, enough material is removed so that the V-shaped notches in the first substrate will be exposed from the back side. In this case also, the single components defined by the notches will be separated. These components can be soldered with a circuit environment directly at their bumps in a known manner.

However, it is also possible to place the single components on a multi-layer carrier in which circuit structures and passive components, if any, are created. Then the carrier can also be used to hold additional components and will be a kind of module substrate. As additional components, we can use discrete or integrated, active or passive components. It is also possible to place additional components of different kinds on the back side of the first substrate S1 and to bond them to the components defined by component structures of the existing component.

Also the production of components of other embodiments according to FIGS. 1, 3, 6 and 7 can be performed at the wafer level, wherein all steps are carried out in parallel for a multiplicity of components.

The invention has been illustrated only on the basis of a few embodiments, but it is not restricted to them. It can be created with all types of components that have sensitive component structures which are located in cavities. Accordingly also, the selection of the substrate materials is left to the technician, with the proviso that at least one of the substrates is anisotropic with regard to the thermal coefficient of expansion and that the second substrate is matched to this coefficient of expansion and thus is as a rule likewise anisotropic. It is particularly preferred to combine on the two substrates, two partial components operating with acoustic waves, for example, two SAW filters or one SAW filter and one filter composed of FBAR resonators. The overall component created on the two substrates can then function like a diplexer, a duplexer or a two-in-one filter, for example, that is, all are components for use in mobile radio apparatus.

The organization of these components on two substrates makes it easily possible to use specific production steps for each component, and also to select the substrate material best suited for the particular component structures essentially independently of the second substrate. Therefore it is in particular possible to place components operating in the 1 GHz range on one substrate, and components operating in the 2 GHz range on the second substrate. Then the particular component type created by the particular component structures can also be selected freely. In this case, a filter can be designed from resonators as a reactance filter, from DMS tracks or from combinations of these elements. In every case a compact component is obtained which has a much smaller base surface area than known components of equivalent performance, and which has only an insignificantly greater height in comparison to a component designed on a single substrate. The production of the components is possible at low cost at the wafer level in a WLP process (Wafer Level Packaging), and thus can be carried out with minimum time and cost expenditure.

The invention claimed is:

1. A component comprising:
a first substrate comprising a first front side for holding first component structures;
a second substrate comprising a second front side for holding second component structures;
an intermediate layer between the first and second substrates for use as a spacer structure, the intermediate layer comprising a structured intermediate layer, the intermediate layer comprising a first layer and a second layer of an electrically insulating material, the intermediate layer comprising recesses in regions of the first and second component structures; and
at least one metallized plane between the first and second layers, the at least one metallized plane comprising circuit paths or circuit path sections that are connected electrically to at least one of the first and second component structures wherein the first and second substrates border the intermediate layer;
wherein the first and second substrates are connected together electrically and mechanically;
wherein the first and second front sides face each other; and
wherein the first and second component structures comprise SAW structures, FBAR structures, MEMS sensors or switches, MEOPS components, or combinations thereof.

2. The component of claim 1, wherein one of the first and second substrates is anisotropic with regard to a respective thermal coefficient of expansion; and
wherein the first and second substrates, when connected together, have coefficients of thermal expansion matched to each other so that a difference in coefficients of thermal expansion in any particular direction within a connecting plane is less than or equal to 3 ppm/K.

3. The component of claim 2, wherein the first and second substrates are different and both are anisotropic with regard to a respective thermal coefficient of expansion.

4. The component of claim 1, further comprising:
an electrical connection between the first and the second component structures in the recesses.

5. The component of claim 1, wherein the first and second component structures comprise components operating with acoustic waves.

6. The component of claim 1, wherein electrical outer connections of the first and second component structures are located on a back side of one of the first and second substrates that does not include component structures.

7. The component of claim 6, further comprising:
a feedthrough from an outer connection on the back side of the first substrate through the first substrate, through the intermediate layer, and onto the front side of the second substrate, wherein the feedthrough through the intermediate layer entirely fills an opening in the intermediate layer.

8. The component of claim 6, wherein the electrical outer connections are connected to the first and second component structures of at least one of the first and second substrates by a feedthrough passing through one of the first and second substrates.

9. The component of claim 6, wherein an outer edge of at least one of the first and second substrates is beveled, and further comprising:
electrical connection lines to connect at least one of the first and second component structures to the electrical outer connections, one of the electrical connection lines being along the outer edge.

10. The component of claim 1, further comprising a carrier;
wherein a composite of the first substrate and the second substrate is attached to the carrier and is electrically connected thereto;
the component comprising outer connections connected to corresponding connecting surfaces on a top side of the carrier;
the carrier comprising solderable contacts on an underside that are connected to the connecting surfaces by feedthroughs; and
wherein spacing of the solderable contacts is greater than spacing of the connecting surfaces and of corresponding spacing of the outer connections.

11. The component of claim 1, wherein the first substrate has a larger surface area than the second substrate; and
wherein the first front side of the first substrate comprises exposed contacts in regions not covered by the second substrate, the exposed contacts being electrically connected to the first component structures.

12. The component of claim 1, wherein at least one of the first and second component structures are formed in a thin layer on a corresponding front side of a corresponding substrate.

13. The component of claim 12, wherein the thin layer comprises a piezoelectric layer, and wherein the at least one of the first and second component structures forms an SAW component.

14. The component of claim 1, wherein component structures of one of the first and second substrates form a SAW component and component structures of another of the first and second substrates form a FBAR component.

15. The component of claim 1, wherein each of the first and second substrates comprises one of LT, LN, quartz, LCP or plastic laminate with anisotropic filler or oriented fiber reinforcement.

16. The component of claim 1, wherein the first and second substrates each comprises piezoelectric material or a thin piezoelectric layer on a front side thereof.

17. The component of claim 16, wherein the first and second substrates comprise a piezoelectric material.

18. The component of claim 1, wherein the intermediate layer comprises an inorganic, hermetically sealed material, selected from ceramic, semiconductor crystal, piezocrystal and metal.

19. The component of claim 1, further comprising:
additional component structures on a back side of at least one substrate.

20. The component of claim 1, wherein connections between connecting sites on the first substrate and on the second substrate comprise columns of Cu or SnCu.

21. The component of claim 1, wherein the at least one metallized plane comprises circuit path segments that are connected to a grounded connection of the component and that have a sufficiently short spacing from the at least one of the first and second component structures of one of the first and second substrates so that, in the event of an overvoltage, an electrical arcing can occur across the short spacing.

22. The component of claim 1, wherein the intermediate layer comprises at least three sublayers, wherein a middle sublayer comprises the at least one metallized layer and has a largest area of the at least three sublayers, wherein an upper sublayer and a lower sublayer comprise spacer structures, each of the spacer structures being between one of the first and second substrates and the middle sublayer; and wherein electrical conductance occurs in, or on, the middle sublayer.

23. The component of claim 22, wherein the middle sublayer comprises a grounded layer, through which all grounded connections of the first and second component structures run laterally with low inductance to outer edges of the component.

24. The component of claim 22, wherein the middle sublayer comprises an isolating layer, the isolating layer comprising metalized layers on one side or both sides of the isolating layer, the metalized layer comprising outward leading, low-inductance circuit paths.

25. The component of claim 1, further comprising additional passive components next to at least one of the first component structures and the second component structures, the additional passive components comprising at least one of resistors, capacitors and inductors.

26. A component comprising:
a first substrate comprising a first front side for holding first component structures;
a second substrate comprising a second front side for holding second component structures; and
additional component structures on a back side of at least one of the first substrate and the second substrate;
wherein the first and second substrates are connected together electrically and mechanically;

wherein the first and second front sides face each other; and
wherein the first and second component structures comprise SAW structures, FBAR structures, MEMS sensors or switches, MEOPS components, or combinations thereof.

27. The component of claim 26, further comprising an intermediate layer that has a frame shape and that surrounds the first and second component structures, and wherein the intermediate layer is sufficiently thick that the first and second component structures are located in a cavity surrounded by the frame shape and covered by the first and second substrates.

28. The component of claim 27, further comprising:
additional support structures in the intermediate layer within the frame shape that are in mechanical contact with both the first and second front sides.

29. The component of claim 26, wherein the second substrate comprises circuit path sections having ends that comprise direct connections to connecting sites on the first component structures;
wherein the component further comprises a structure that is electrically isolated and mechanically decoupled from the direct connections.

30. The component of claim 26, further comprising:
a first layer on the first substrate and comprising isolated structured regions which are not coincident with corresponding structured regions of a second layer in the intermediate layer; and
circuit path sections connected to the first component structures on the isolated structured regions, the circuit path sections crossing over another structure that is on the first substrate and is electrically isolated and mechanically decoupled from the circuit path sections.

31. A component comprising:
a first substrate comprising a first front side for holding first component structures;
a second substrate comprising a second front side for holding second component structures;
wherein the first and second substrates are connected together electrically and mechanically;
wherein the first and second front sides face each other;
wherein the first and second component structures comprise SAW structures, FBAR structures, MEMS sensors or switches, MEOPS components, or combinations thereof;
wherein the second substrate comprises circuit path sections having ends that comprise direct connections to connecting sites on the first component structures; and
wherein the component further comprises a structure that is electrically isolated and mechanically decoupled from the direct connections.

32. A method for producing a component, comprising:
forming first component structures for a plurality of components on a front side of a first substrate;
forming additional component structures for a plurality of components on a front side of a second substrate;
forming an intermediate layer between the first and second substrates for use as a spacer structure, the intermediate layer comprising a structured intermediate layer, the intermediate layer comprising a first layer and a second layer of an electrically insulating material, the intermediate layer comprising recesses in regions of the first and second component structures; and
forming at least one metallized plane between the first and second layers, the at least one metallized plane comprising circuit paths or circuit path sections that are connected electrically to at least one of the first and second component structures
wherein the first and second substrates border the intermediate layer;
wherein a front side of at least one of the substrates comprises the structured intermediate layer that encloses component structures in a frame-like manner;
wherein the first and second substrates are connected together electrically and mechanically with front sides facing each other; and
wherein the structured intermediate layer comprises a spacer.

33. The method of claim 32, wherein at least one of the first and second substrates is thinned by grinding after connection together.

34. The method of claim 32, further comprising:
forming electrical outer contacts on a back side of the second substrate;
wherein component structures of the first and second substrates are connected to the outer contacts by electrical connection lines and/or feedthroughs.

35. The method of claim 33, wherein, after connection, the second substrate is sawn from the back side and divided into component regions separated from each other; and
further comprising forming connection lines in sawn sites that connect outer contacts on the back side of the second substrate to component structures of the first and second substrate.

36. The method of claim 32, further comprising:
forming additional intermediate layers on the first and second substrates; and
forming circuit path sections on one of the additional intermediate layers, the circuit path sections being connected to component structures, wherein circuit path sections produce circuit path intersections.

37. The method of claim 32, further comprising:
structuring intermediate layers comprised of metal on the first and second substrates to form frame-like spacer structures;
wherein the first and second substrates are connected together by diffusion soldering of the intermediate layers.

38. The method of claim 32, further comprising forming additional passive components next to at least one of the first component structures and the second component structures, the additional passive components comprising at least one of resistors, capacitors and inductors.

39. A component comprising:
a first substrate comprising a first front side for holding first component structures;
a second substrate a second front side for holding second component structures;
wherein the first and second substrates are connected together electrically and mechanically;
wherein the first and second front sides face each other;
wherein the first and second component structures comprise SAW structures, FBAR structures, MEMS sensors or switches, MEOPS components, or combinations thereof; and
wherein the at least one of the first and second component structures of one of the first and second substrates form a SAW component and component structures of another of the first and second substrates form a FBAR component.

* * * * *

UNITED STATES PATENT AND TRADEMARK OFFICE
CERTIFICATE OF CORRECTION

PATENT NO. : 8,294,535 B2  Page 1 of 1
APPLICATION NO. : 11/916720
DATED : October 23, 2012
INVENTOR(S) : Gregor Feiertag et al.

It is certified that error appears in the above-identified patent and that said Letters Patent is hereby corrected as shown below:

Column 18, Line 3, Claim 32;
Delete "structures" and Insert -- structures; --

Signed and Sealed this
Twenty-second Day of January, 2013

David J. Kappos
*Director of the United States Patent and Trademark Office*